United States Patent
Volkovich et al.

(10) Patent No.: US 10,763,146 B2
(45) Date of Patent: Sep. 1, 2020

(54) RECIPE OPTIMIZATION BASED ZONAL ANALYSIS

(71) Applicant: KLA-TENCOR CORPORATION, Milpitas, CA (US)

(72) Inventors: Roie Volkovich, Hadera (IL); Michael Adel, Ya'akov Zichron (IL); Liran Yerushalmi, Zicron Yaacob (IL); Eitan Herzel, Givat-Ela (IL); Mengmeng Ye, Shanghai (CN); Eran Amit, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 287 days.

(21) Appl. No.: 15/751,514

(22) PCT Filed: Dec. 11, 2017

(86) PCT No.: PCT/US2017/065629
§ 371 (c)(1),
(2) Date: Feb. 9, 2018

(87) PCT Pub. No.: WO2018/217232
PCT Pub. Date: Nov. 29, 2018

(65) Prior Publication Data
US 2019/0088514 A1  Mar. 21, 2019

Related U.S. Application Data

(60) Provisional application No. 62/509,679, filed on May 22, 2017.

(51) Int. Cl.
*H01L 21/67* (2006.01)
*G01D 18/00* (2006.01)
*H01L 21/66* (2006.01)

(52) U.S. Cl.
CPC ....... *H01L 21/67276* (2013.01); *G01D 18/00* (2013.01); *H01L 22/20* (2013.01); *H01L 22/12* (2013.01)

(58) Field of Classification Search
CPC .............. G01D 18/00; G05B 19/401; G05B 2219/45031; H01L 21/67276; H01L 22/12; H01L 22/20
(Continued)

(56) References Cited

U.S. PATENT DOCUMENTS

| | | |
|---|---|---|
| 7,570,796 B2 | 8/2009 | Zafar et al. |
| 2006/0250611 A1 | 11/2006 | Velidandla et al. |

(Continued)

FOREIGN PATENT DOCUMENTS

JP  2012150065 A  8/2012

OTHER PUBLICATIONS

ISA/KR, International Search Report and Written Opinion for PCT/US2017/065629 dated Mar. 30, 2018.

*Primary Examiner* — John H Le
(74) *Attorney, Agent, or Firm* — Hodgson Russ LLP

(57) ABSTRACT

Metrology methods and modules are provided, which comprise carrying out recipe setup procedure(s) and/or metrology measurement(s) using zonal analysis with respect to respective setup parameter(s) and/or metrology metric(s). The zonal analysis comprises relating to spatially variable values of the setup parameter(s) and/or metrology metric(s) across one or more wafers in one or more lots. Wafer zones may be discrete or spatially continuous, and be used to weight one or more parameter(s) and/or metric(s) during any of the stages of the respective setup and measurement processes.

13 Claims, 9 Drawing Sheets

(58) Field of Classification Search
USPC ....... 702/123, 127, 155; 356/237.2; 382/144
See application file for complete search history.

(56) References Cited

U.S. PATENT DOCUMENTS

| | | |
|---|---|---|
| 2007/0177136 A1 | 8/2007 | Nakano et al. |
| 2009/0037134 A1* | 2/2009 | Kulkarni ............ G01N 21/9501 702/127 |
| 2009/0324055 A1 | 12/2009 | Auerbach |
| 2014/0273291 A1 | 9/2014 | Huang et al. |
| 2018/0047646 A1* | 2/2018 | Bringoltz ................ H01L 22/20 |

* cited by examiner

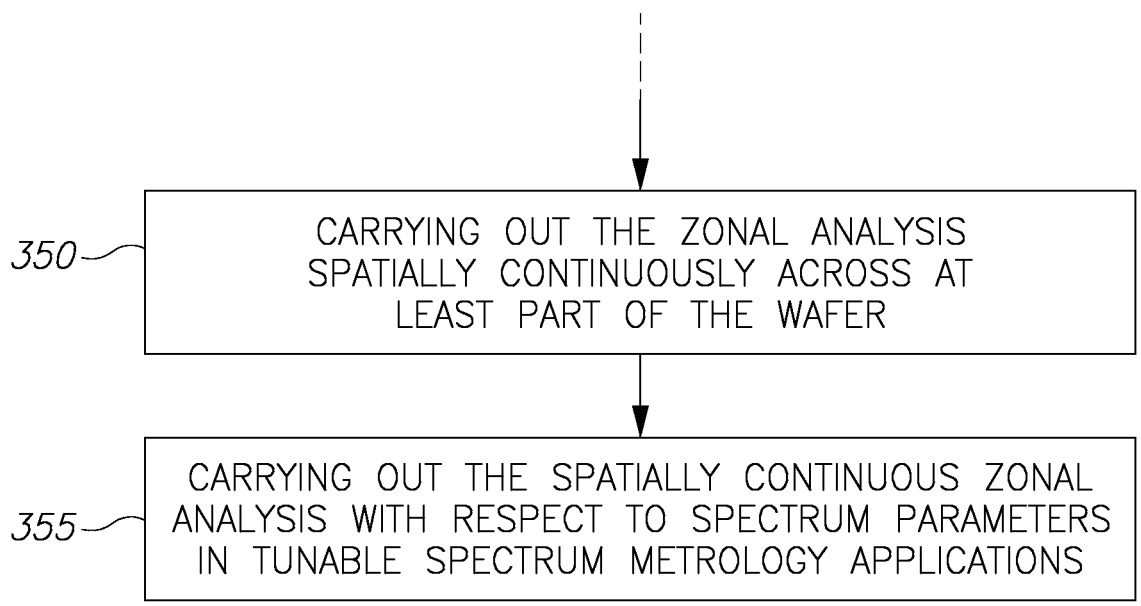
Figure 8 (cont. 1)

RECIPE OPTIMIZATION BASED ZONAL ANALYSIS

CROSS REFERENCE TO RELATED APPLICATIONS

This application claims the benefit of U.S. Provisional Patent Application No. 62/509,679 filed on May 22, 2017, which is incorporated herein by reference in its entirety.

BACKGROUND OF THE INVENTION

1. Technical Field

The present invention relates to the field of metrology, and more particularly, to metrology recipe setup and measurement procedures.

2. Discussion of Related Art

Metrology measurements are carried out according to measurement recipes, which are optimized according to setup and measurement parameters. For example, U.S. Pat. No. 7,570,796, which is incorporated herein by reference in its entirety, discloses various methods and systems for utilizing design data in combination with inspection data such as by comparing portions of design data in proximate positions to the defects in design data space and binning the defects in groups such that the portions of the design data proximate the positions of the defects in each of the groups are at least similar.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising carrying out a recipe setup procedure using zonal analysis with respect to at least one setup parameter, wherein the zonal analysis comprises spatially variable values of the at least one setup parameter across at least one wafer.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
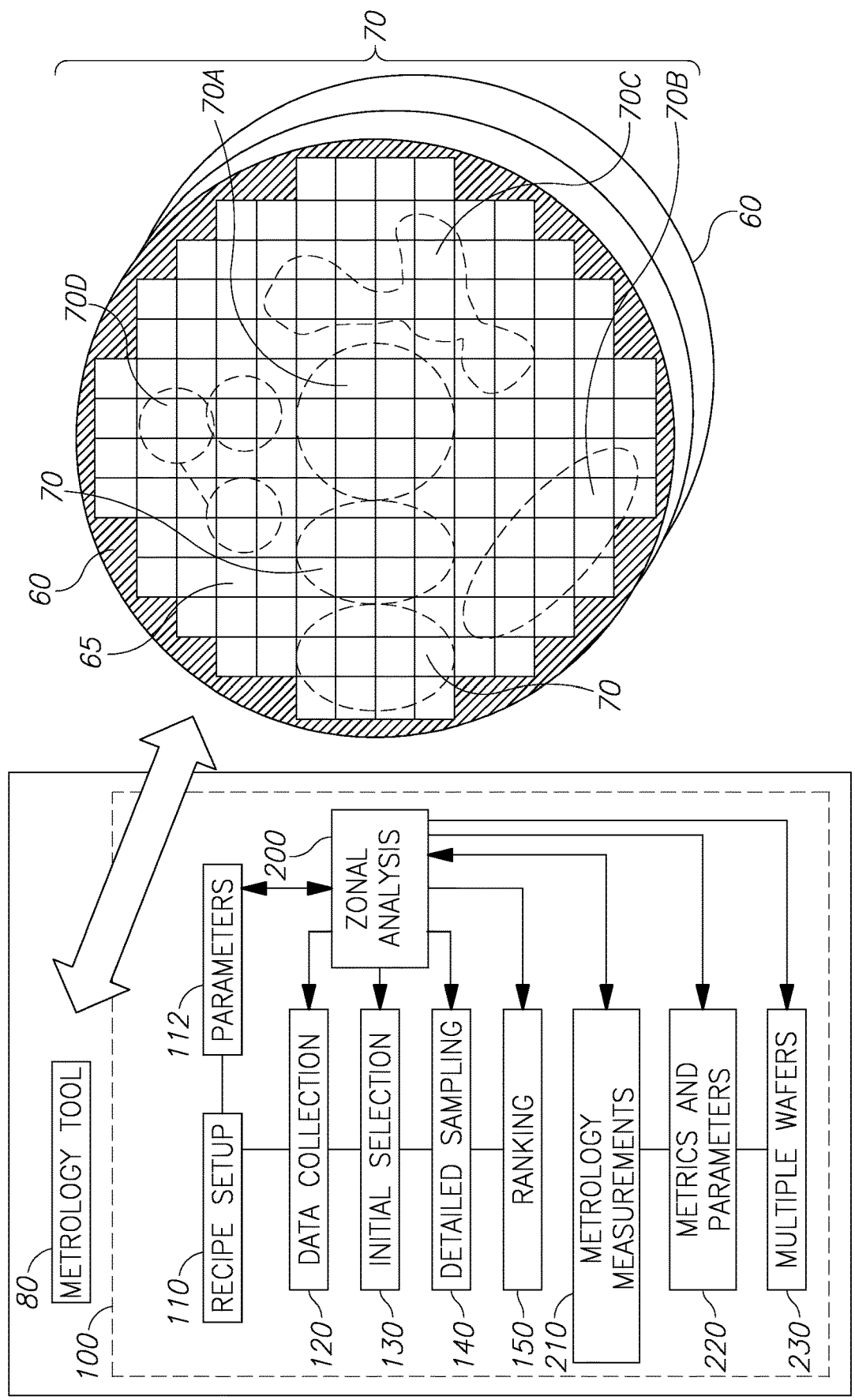
FIG. 1 is a high-level schematic illustration of a metrology tool having a metrology module configured to carry out zonal analysis with respect to various zones on wafer(s)—during any of a variety of recipe setup and/or measurement steps, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting. It is noted that while the disclosure is aimed at optical illumination radiation, it may be extended to applications in which the illumination radiation is at very short wavelengths such as x ray or includes particles beams.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanism for metrology recipe optimization which is based on wafer zone analysis and thereby provide improvements to the technological field of metrology. Zonal analysis may be implemented during recipe selection and/or during production, and may also be used as a defense system for detecting, monitoring and correcting for process variation and process excursions—as disclosed herein.

Metrology methods and modules are provided, which comprise carrying out recipe setup procedure(s) and/or metrology measurement(s) using zonal analysis with respect to respective setup parameter(s) and/or metrology metric(s). The zonal analysis comprises relating to spatially variable values of the setup parameter(s) and/or metrology metric(s) across one or more wafers in one or more lots. Wafer zones may be discrete or spatially continuous, and be used to weight one or more parameter(s) and/or metric(s) during any of the stages of the respective setup and measurement processes.

FIG. 1 is a high-level schematic illustration of a metrology tool 80 having a metrology module 100 configured to carry out zonal analysis 200 with respect to various zones 70 on wafer(s) 60—during any of a variety of recipe setup and/or measurement steps, as disclosed in the following, according to some embodiments of the invention.

FIG. 1 illustrates schematically various types of zones 70, such as a central zone 70A, a marginal zone 70B, an intermediate, possibly partly convex zone 70C, interconnected sub-zones (cluster) 70D, etc., any of which may be identified and utilized in zone analysis 200 disclosed below. Zones 70 may be defined as a number of dies 65 and/or as continuous or semi-continuous regions on wafer 60.

Metrology module 100 may be configured to implement zonal analysis 200 during various stages of recipe setup 110, such as any of data collection phase 120, initial selection phase 130, detailed sampling phase 140, ranking phase 150 and with respect to one or more parameter 112—as explained below in detail, and/or implement zonal analysis 200 during various stages of carrying out metrology measurements 210 and with respect to metric(s) and/or parameter(s) 220 of the measurements and/or with respect to multiple wafer 230, lots and batches, as disclosed below.

Figure 2:
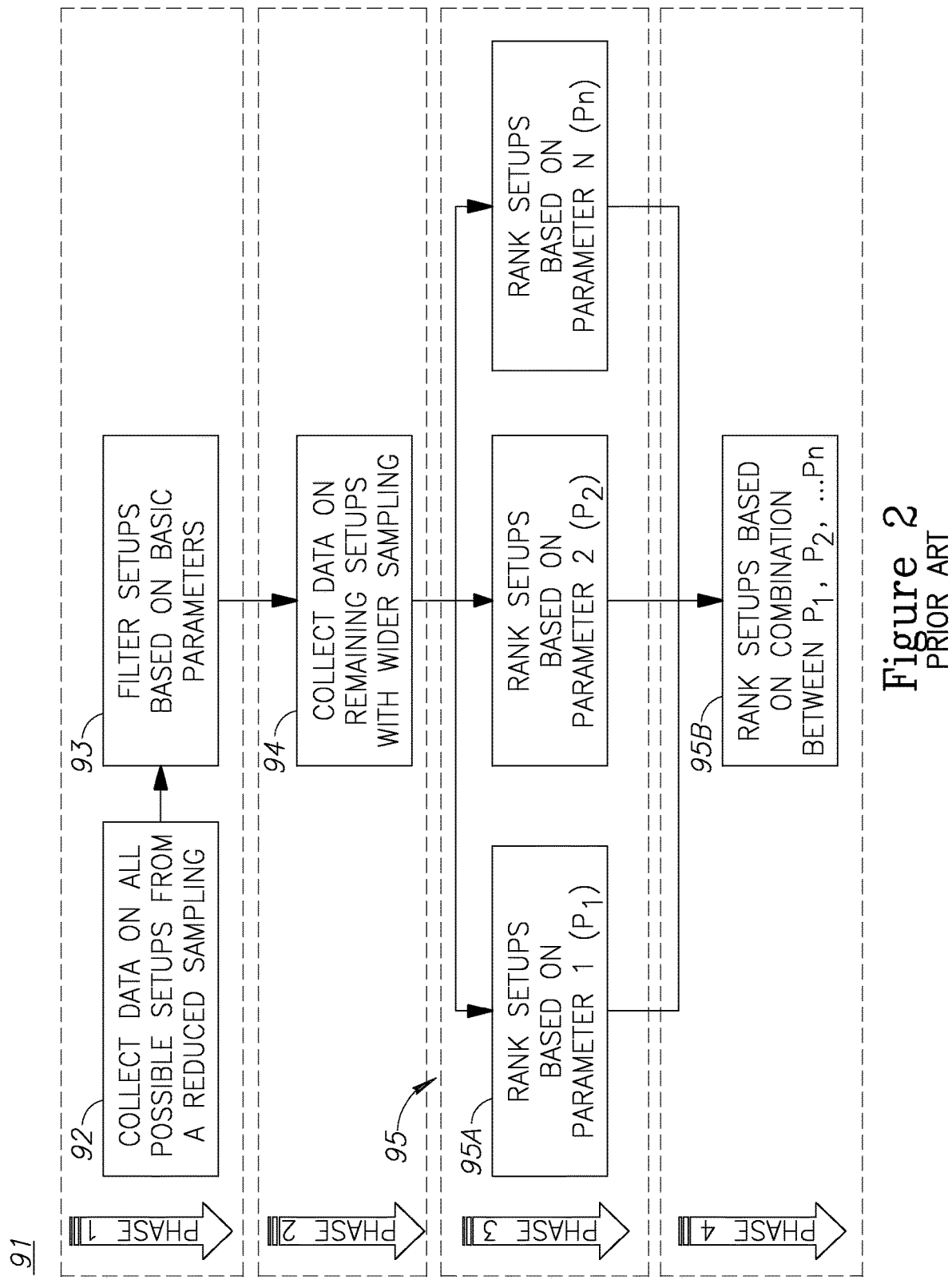
FIG. 2 is a schematic example for a recipe optimization flow according to the prior art.

Current recipe optimization methods 91 are based on full wafer analysis with different sampling methods. The optimization may be performed using several parameters or metrics that the metrology tool provides, such as overlay, residuals, quality matrices and others. FIG. 2 is a schematic example for a recipe optimization flow 91 according to the prior art. In Phase 1, data is collected on a reduced sampling plan for all possible setups (stage 92) and filtration of the setups is performed based on basic parameters (stage 93), such as sensitivity and basic measurements quality. In Phase 2, data is collected using a more extended sampling plan for the filtered setups (stage 94) and in Phase 3, the recipe optimization is performed based on additional tool metrology parameters ($P_1 \ldots P_n$), such as overlay, residuals, tool performance parameters, quality matrices, etc., wherein the setups are ranked 95A according to these parameters. Finally, in Phase 4, the ranking of the different setups 95B is calculated based on Phase 3 results, with regard to weights assigned to each of the parameters ($P_1 \ldots P_n$). In phases 3 and 4, the analysis is performed on the full wafer, depending on the measured sampling, without taking into consideration the contribution of different wafers zones and the varying ways they are impacted by the lithography process. For example, wafer edges are much more sensitive to registration errors then the wafer center, but since optimization is carried out on full wafers without considering the differences between the wafer edges and the wafer center, prior art recipe optimization may be lacking with respect to accuracy and applicability.

Disclosed metrology modules 100 and methods 200 are configured to overcome prior art limitations and handle the varying wafer zone sensitivity to the lithographic process by using zonal analysis 200 as part of recipe optimization process 110. As non-limiting examples, zonal analysis 200 may be applied at any of stages 120 (data collection), 130 (initial selection), 140 (detailed sampling) and/or ranking phases 150A, 150B.

Figure 3:
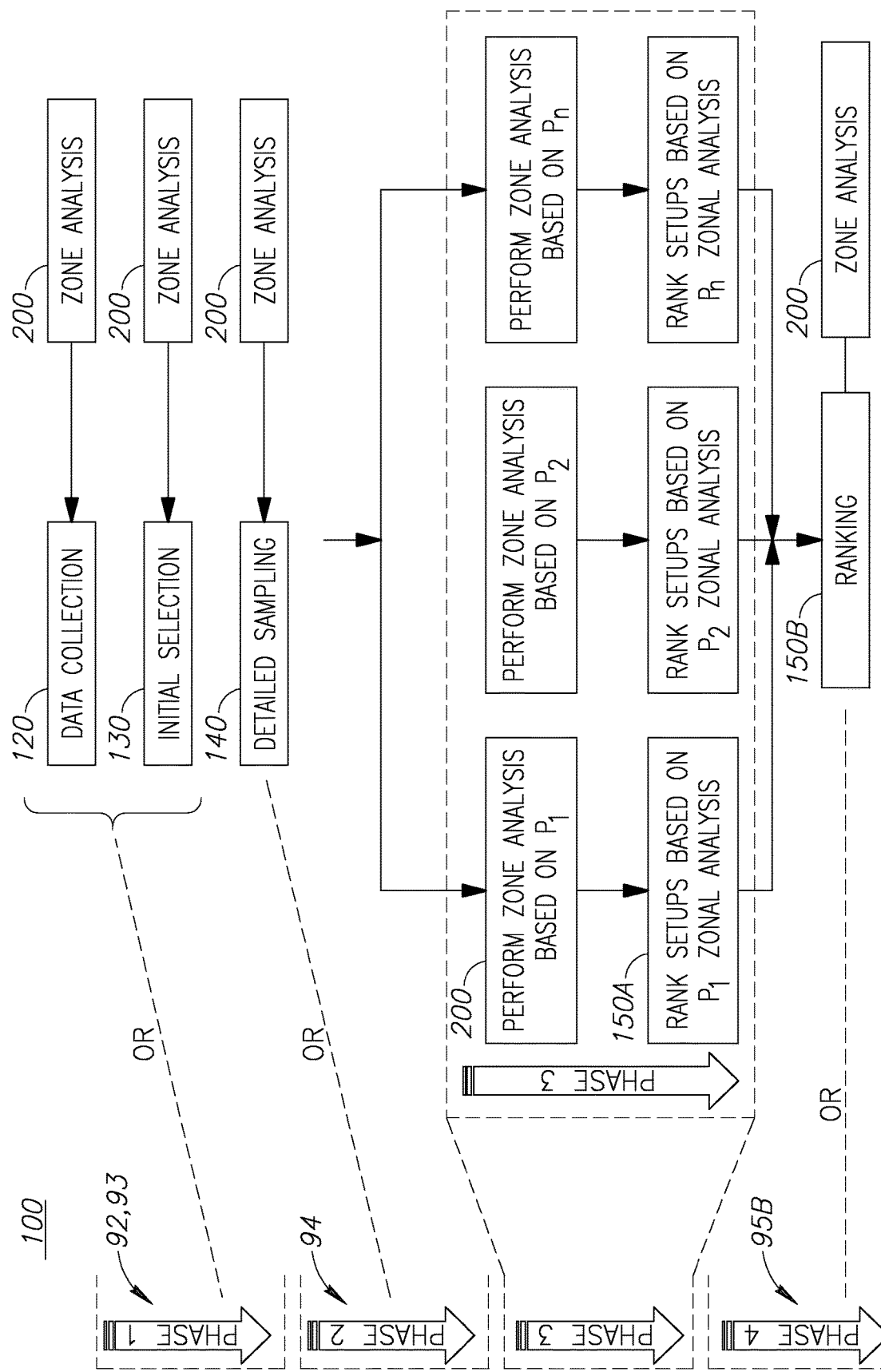
FIGS. 3 and 5 are high-level schematic illustrations of the application of the zone analysis during recipe setup, according to some embodiments of the invention.

FIG. 3 is a high-level schematic illustration of the application of zone analysis 200 during recipe setup 110, according to some embodiments of the invention. In the illustrated, non-limiting example, zone analysis 200 is implemented for Phase 3, and as illustrated as optional implementation for Phases 1, 2 and/or 4. Prior art stages 92, 93, 94 and 95B may be applied in combination with disclosed ranking 150A in which zone analysis 200 is implemented. In a non-limiting example, zonal analysis approach 200 may be implemented during Phase 3 of recipe optimization flow 110 by performing ranking setup per tool parameter 150A after taking into consideration different wafers zones 70 in the ranking regarding each parameter ($P_1 \ldots P_n$). Zonal analysis 200 may be implemented with respect to various wafer zones 70 on one or multiple wafers 60, e.g., multiple wafers 60 per lot or multiple wafers 60 in multiple lots. Zonal analysis 200 may be implemented in any of the other stages of recipe setup such as any of data collection phase 120, initial selection phase 130, detailed sampling phase 140, ranking phase 150B and with respect to one or more parameter and/or metric.

Figure 4:
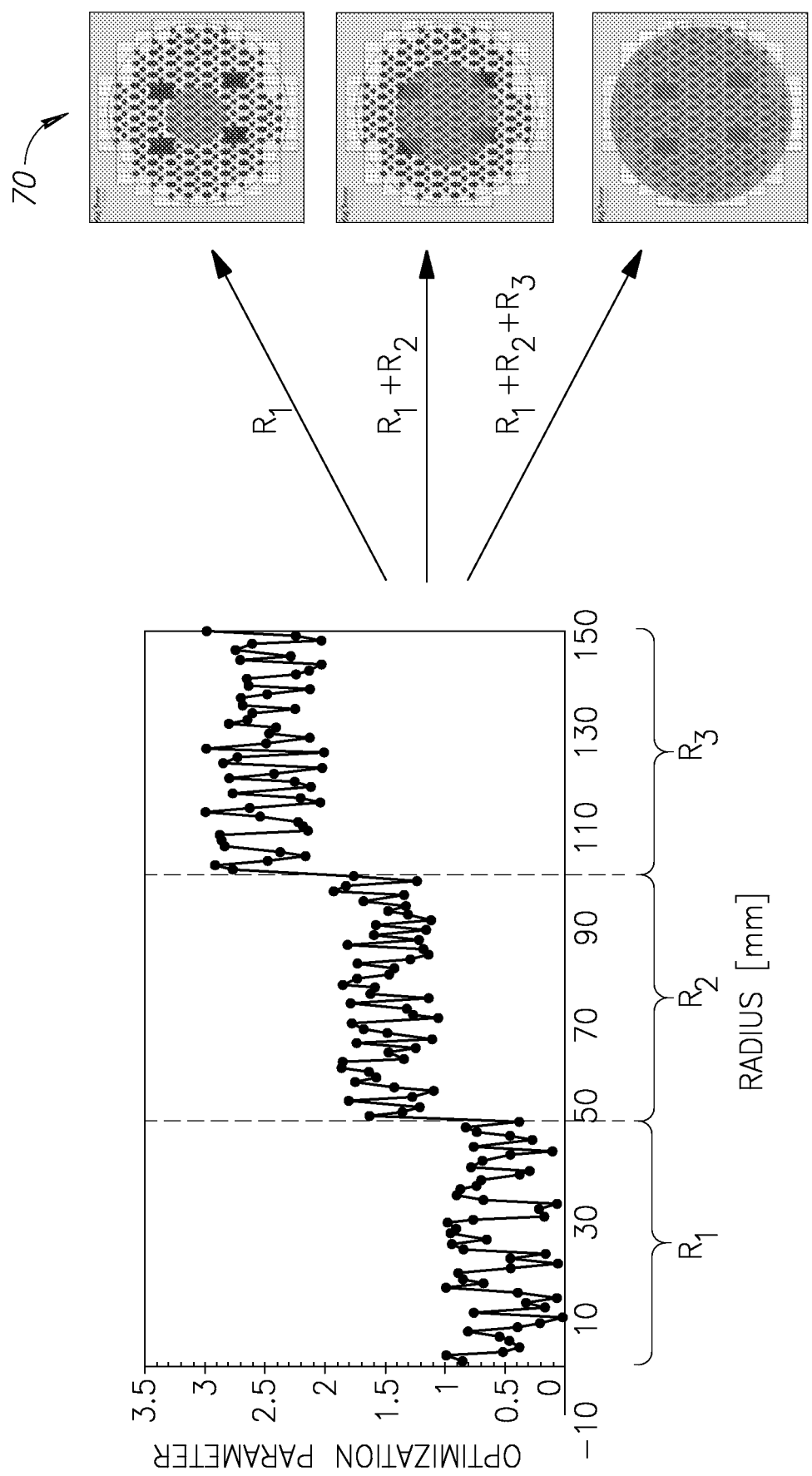
FIG. 4 is a high-level schematic example for determining wafer zones, according to some embodiments of the invention.

FIG. 4 is a high-level schematic example for determining wafer zones 70, according to some embodiments of the invention. Division of wafer 60 to zones 70 may be carried out using various consideration and parameters, such as derived, e.g., by analyzing different tool parameters such as overlay, residuals, quality matrices etc. In certain embodiments, different zones 70 may be used with respect to different parameters. FIG. 4 illustrated schematically zone division according to the residual as the tool optimization parameter, and wafer 60 is divided into three zones according to the tool parameter behavior. For example, zones 70 may comprise any of: distinct concentric zones, concentric rings which may partly overlay, concentric circles enclosing and including each other and/or combinations thereof, possibly configured to distinguish at least wafer center 70A from wafer edges 70B (also see FIG. 1).

Figure 5:
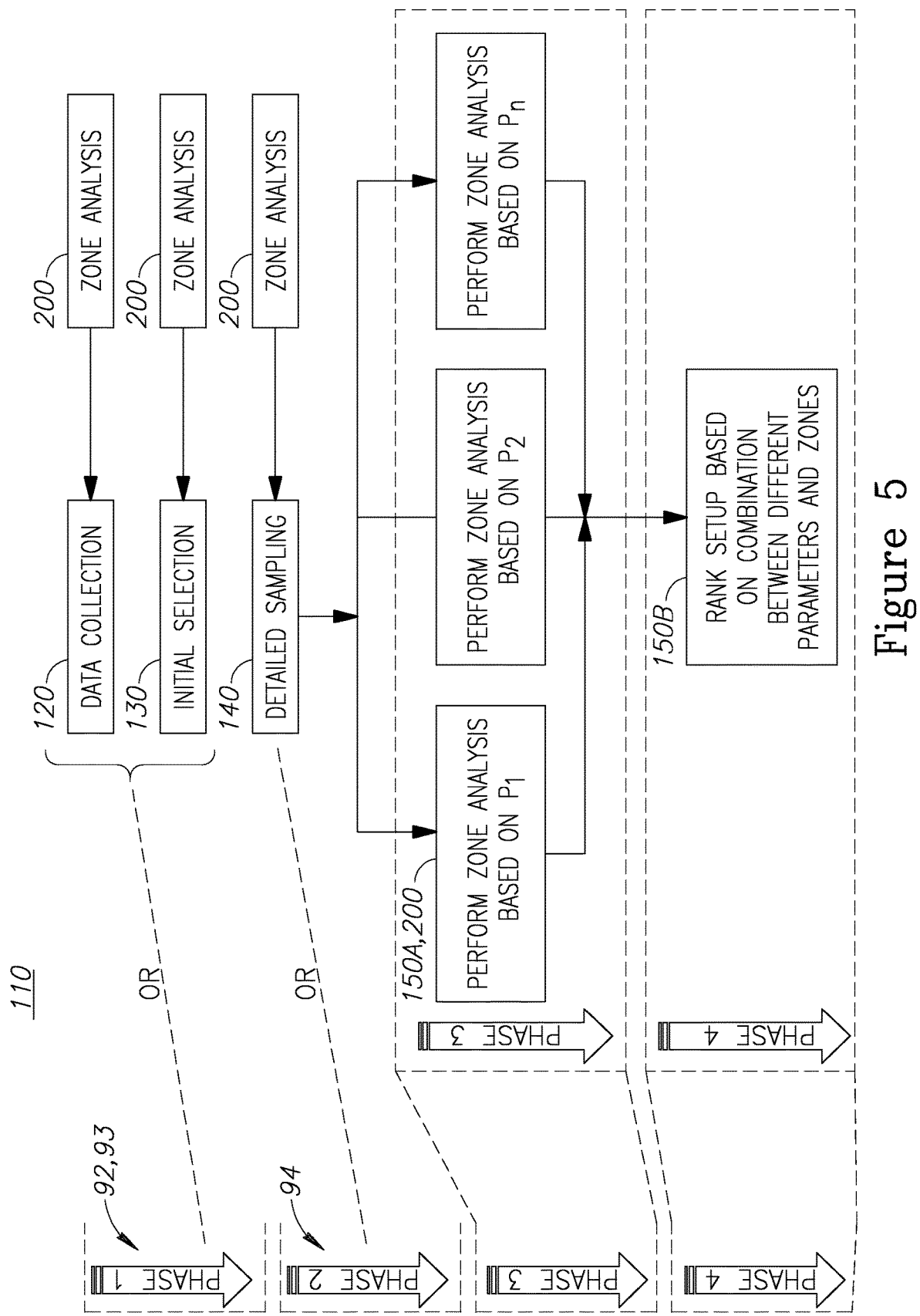

FIG. 5 is a high-level schematic illustration of the application of zone analysis 200 during recipe setup 110, according to some embodiments of the invention. In the illustrated, non-limiting example, zone analysis 200 is implemented for Phases 3 and 4, and as illustrated as optional implementation for Phases 1 and/or 2. Prior art stages 92, 93 and 94 may be applied in combination with disclosed rankings 150A, 150B in which zone analysis 200 is implemented. In a non-limiting example, zonal analysis approach 200 may be implemented during Phases 3 and 4 of recipe optimization flow 110 by performing ranking setup per tool parameter 150A after taking into consideration different wafers zones 70 in the ranking regarding each parameter ($P_1 \ldots P_n$), as well as weighted rank setup 150B which may be carried out by taking into consideration different wafers zones 70 in relation to the different parameters ($P_1 \ldots P_n$). Rankings 150A, 150B may be performed, respectively, per tool parameter(s) and/or per combinations of different tool parameters and different zones. Zonal analysis 200 may be implemented with respect to various wafer zones 70 on one or multiple wafers 60, e.g., multiple wafers 60 per lot or multiple wafers 60 in multiple lots. Zonal analysis 200 may be implemented in any of the other stages of recipe setup such as any of data collection phase 120, initial selection phase 130, detailed sampling phase 140 and with respect to one or more parameter and/or metric.

Returning to FIG. 1, certain embodiments comprise implementing zonal analysis 200 during production (in metrology measurements 210) and not only for recipe selection 110. The tool parameters may be collected in parallel to production flow and zonal analysis 200 may be implemented with respect to various metric and parameters to optimize metrology measurements 220 and/or as a defense system for detecting, monitoring and correcting for process variation and process excursions, and advantageously capture process variation changes and excursions earlier and more accurately than prior art methods.

Various embodiments comprise implementing zonal analysis 200 as disclosed herein in either or both on stand-alone and integrated metrology tools 80 applying imaging and/or scatterometry metrology methodologies, or any other metrology technology.

Advantageously, with respect to prior art approaches such as described in U.S. Pat. No. 7,570,796, which compare portions of design data in proximate positions to the defects in design data space and determine if the design data in the portions is at least similar based on results of the comparing step—current embodiments optimize the recipe setup based on more comprehensive zonal analysis.

Figure 6:
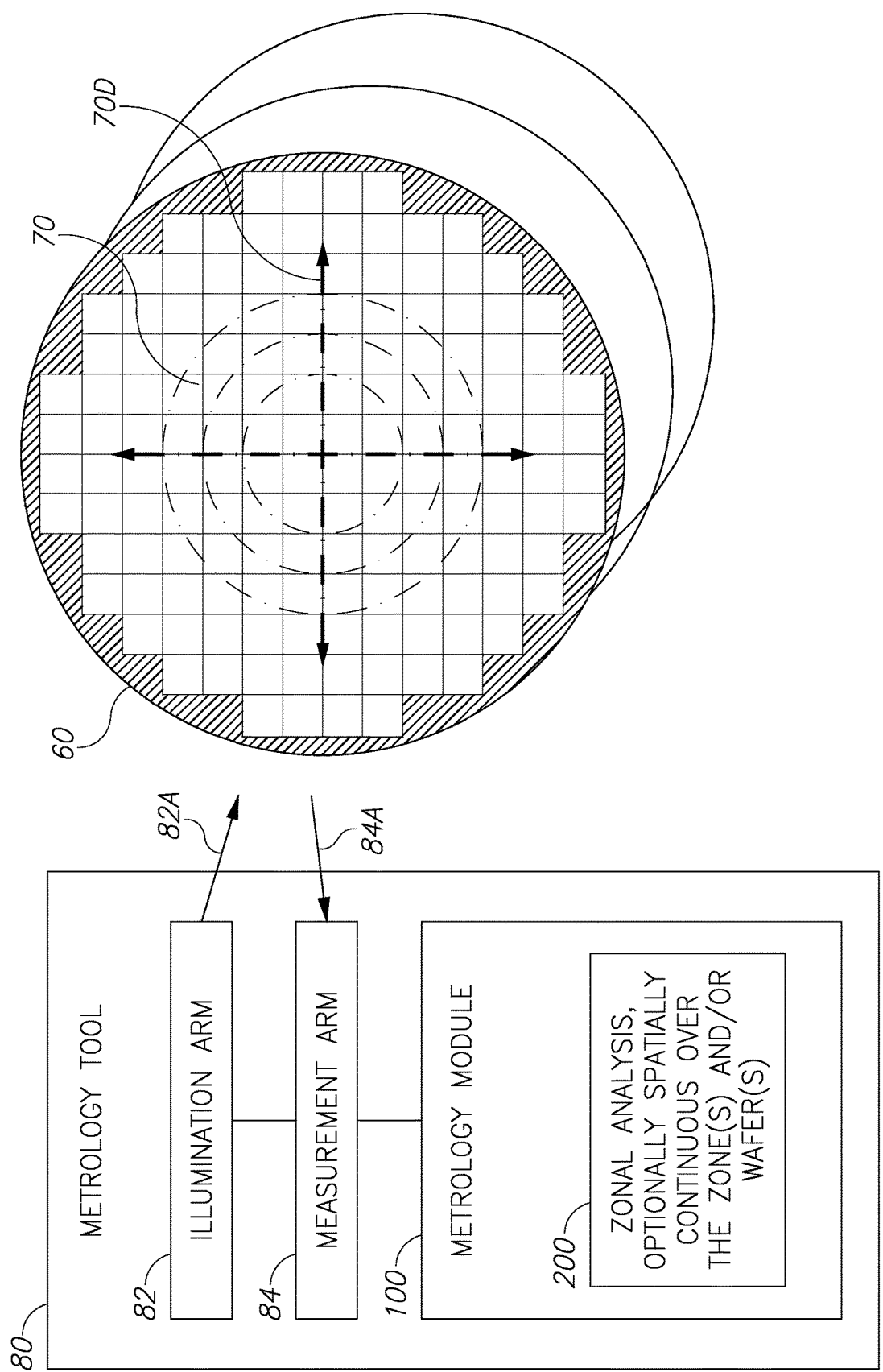
FIG. 6 is a high-level schematic illustration of the metrology tool with the metrology module configured to operate with tunable spectrum, according to some embodiments of the invention.

FIG. 6 is a high-level schematic illustration of metrology tool 80 with metrology module 100 configured to operate with tunable spectrum, according to some embodiments of the invention. Metrology tool 80 may comprise an illumination arm 82 providing illumination radiation 82A which may be tunable in this wavelength (tunable spectrum illumination). Metrology tool 80 further comprises measurement arm 84 receiving radiation 84A (e.g., image signals at the field plane of imaging tool 80 and/or diffraction signals at the pupil plane of scatterometry tool 80) and delivering the signals to metrology module 100 for analysis. Metrology module 100 may implement zonal analysis 200 as disclosed herein, according to zones 70 and/or at least partly spatially continuously (indicated schematically by arrows 70D) over zones 70 and/or wafers 60.

In metrology tools 80 with tunable spectrum in illumination arm 82, the difference between the measurement conditions of the different zones may be infinitesimal. The dependency of the optimal spectrum parameters (e.g., wavelength, bandwidth, power) may be determined as a continuous function (illustrated schematically by arrows 70D) of the wafer position and/or field position. In certain embodiments, the measurement conditions may be optimized at different positions, possibly spatially continuously, as least in one or some of zones 70.

In certain embodiments, one or more process-related parameters which have known correlation(s) to the optimal measurement conditions may be measured, for example—layer or element thickness, critical dimension (CD) and/or the light phase difference. The e measured parameter(s) may be directly measured and/or derived from another inspection tool or monitoring measurements (e.g., electrical tests, yield analysis). Zonal analysis 200 may be carried out, possibly at least partly spatially continuously, with respect to the one or more process-related parameters.

Figure 7:
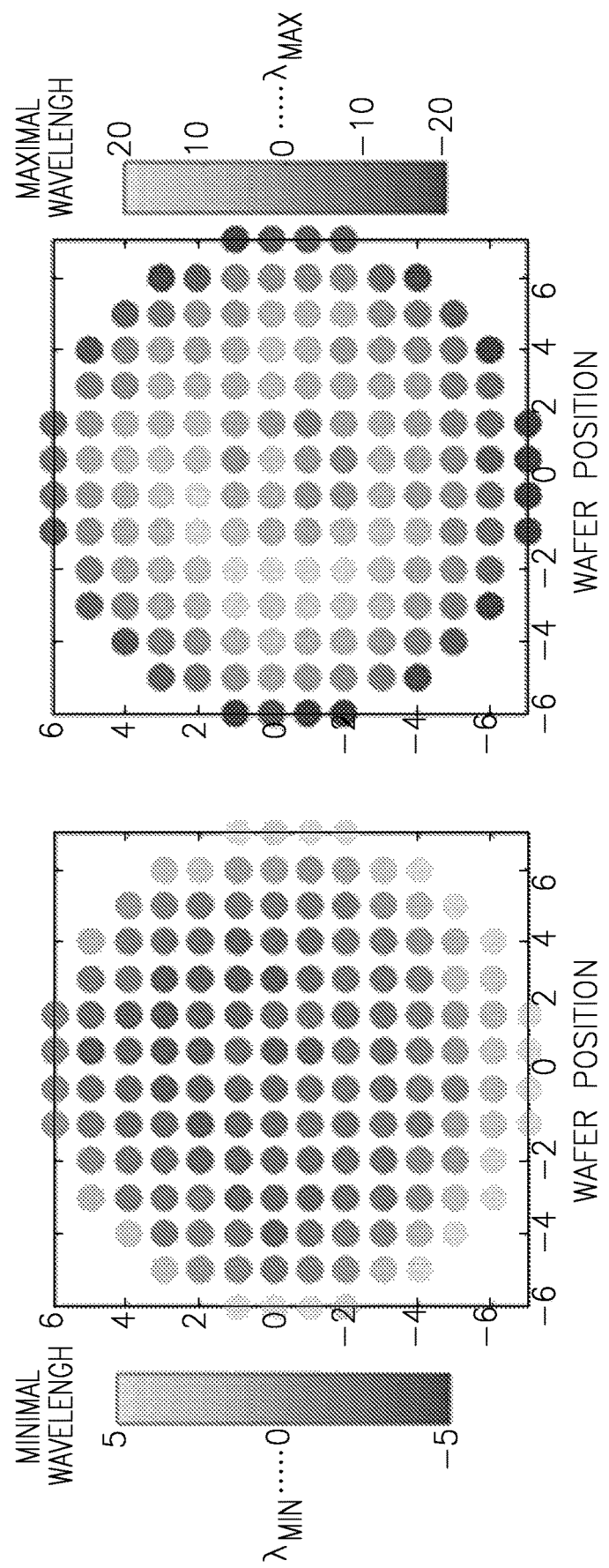
FIG. 7 is a high-level schematic example for spatially continuous wafer zone analysis, according to some embodiments of the invention.

FIG. 7 is a high-level schematic example for spatially continuous wafer zone analysis 200, according to some embodiments of the invention. FIG. 7 illustrates measurements of a continuous behavior of the valid wavelength range parameter is plotted, with the minimal and maximal wavelengths plotted with respect to wafer position on the left-hand and right-hand diagrams, respectively—to indicate the limits of the valid wavelength range across the wafer. The minimal and maximal wavelengths are provided with respect to reference values indicated $\lambda_{min}$ and $\lambda_{max}$, respectively—and indicate the wavelength range for each site on the wafer. The middle of the valid range may be used as the optimal wavelength, and may be calculated as a function of wafer position in a spatially continuous manner. In the illustrated non-limiting example, the wavelength range is correlated to the layer thickness of, e.g., the photo resist layer or the hard mask, and may be calculated using film measurements done on a different metrology/process tool.

Advantageously, zonal analysis 200 may be carried out per wafer and/or for multiple wafers for any of: improving recipe selection, optimizing the metrology recipe during production, modeling of the optimal measurement conditions as function of wafer and/or field position and/or feedforward of process parameters to the metrology tool in order to generate the zone analysis; as well as to be implemented as a defense system for process variations or process excursions.

Figure 8:
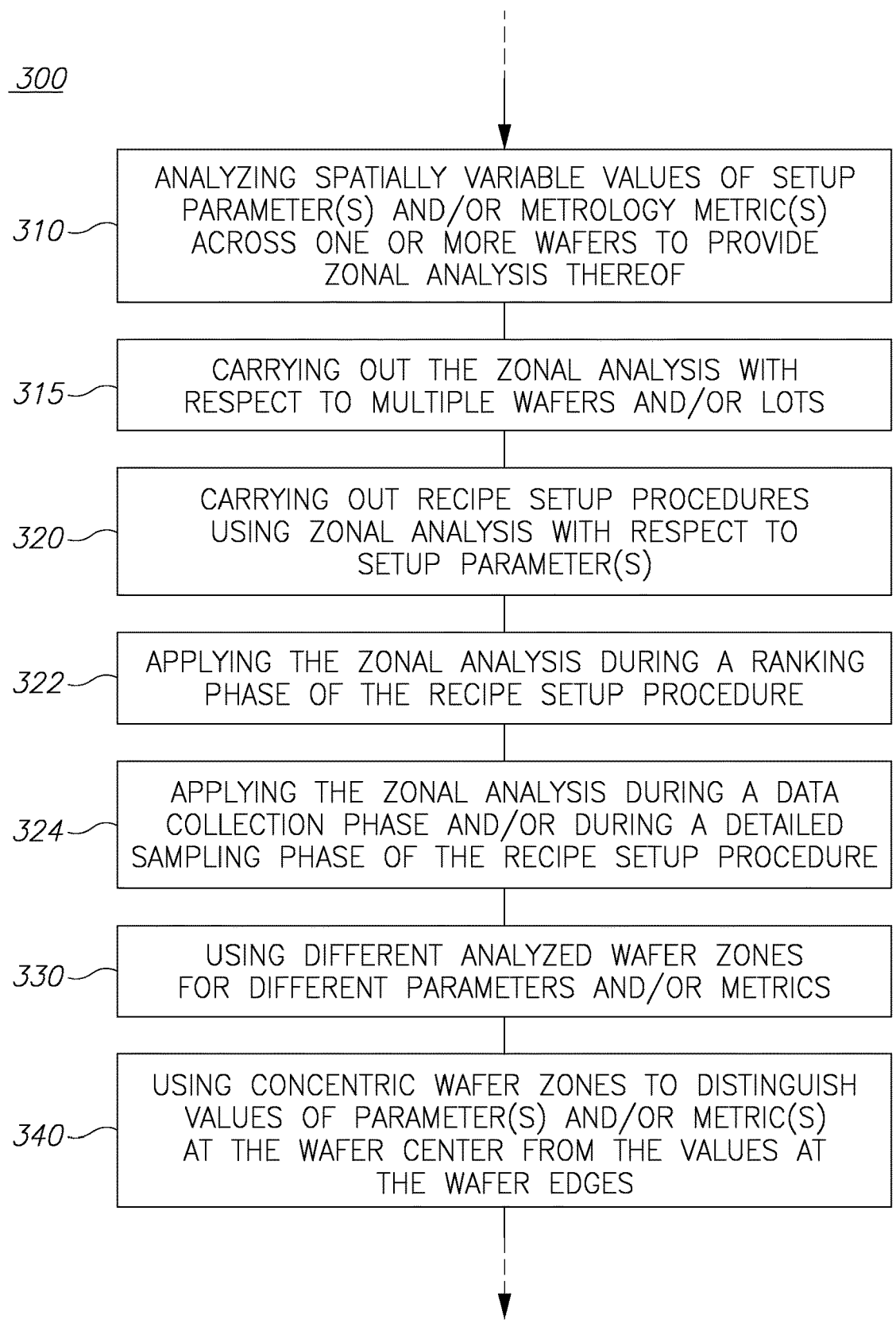
FIG. 8 is a high-level flowchart illustrating a method, according to some embodiments of the invention.

FIG. 8 is a high-level flowchart illustrating a method 300, according to some embodiments of the invention. The method stages may be carried out with respect to metrology module 110 and zonal analysis 200 described above, which may optionally be configured to implement method 300. Method 300 may be at least partially implemented by at least one computer processor, e.g., in a metrology module. Certain embodiments comprise computer program products comprising a computer readable storage medium having computer readable program embodied therewith and configured to carry out the relevant stages of method 300. Method 300 may comprise the following stages, irrespective of their order.

Method 300 may comprise analyzing, spatially, variable values of setup parameter(s) and/or metrology metric(s) across one or more wafers to provide zonal analysis thereof (stage 310) and optionally carrying out the zonal analysis with respect to multiple wafers and/or lots (stage 315). Zonal analysis 200 disclosed above may incorporate at least part of analyzing 310, and/or at least part of method 300.

Method 300 may further comprise carrying out one or more recipe setup procedure(s) using zonal analysis with respect to at least one setup parameter (stage 320), wherein the zonal analysis comprises spatially variable values of the at least one setup parameter across at least one wafer. The setup parameter(s) may comprise, e.g., sensitivity, accuracy indicators, target quality indicators, performance indicators (e.g., precision, TIS, matching, signal quality, etc.), process indicators (e.g., thickness variations, SWA, CD, etc.) and so forth.

Method 300 may comprise applying the zonal analysis during a ranking phase of the recipe setup procedure (stage 322) and/or during a data collection phase and/or during a detailed sampling phase of the recipe setup procedure (stage 324).

In certain embodiments, method 300 may comprise using different analyzed wafer zones for different parameters and/or metrics (stage 330), e.g., the at least one setup parameter may comprise a plurality of setup parameters and the zonal analysis may comprise different wafer zones with respect to different parameters.

In certain embodiments, method 300 may comprise carrying out metrology measurements using the zonal analysis with respect to at least one metrology metric (see stage 310). The at least one metrology metric may comprise a plurality of metrology metrics and the zonal analysis may comprise different wafer zones with respect to different metrics (see stage 330). The metrology metric (s) may comprise, e.g., overlay, residuals, tool performance parameters, and quality matrices.

In certain embodiments, the zonal analysis may be carried out with respect to concentric zones configured to distinguish at least a wafer center from wafer edges. Correspondingly, method 300 may comprise using concentric wafer zones to distinguish values of parameter(s) and/or metric(s) at the wafer center from the values at the wafer edges (stage 340).

In certain embodiments, the zonal analysis may be carried out in a spatially continuous manner. Correspondingly, method 300 may comprise carrying out the zonal analysis spatially continuously across at least part of the wafer (stage 350). For example, the zonal analysis may be carried out with respect to tunable spectrum illumination (and the at least one setup parameter comprise an illumination wavelength). Correspondingly, method 300 may comprise carrying out the spatially continuous zonal analysis with respect spectrum parameters in tunable spectrum metrology applications Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function (s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
    carrying out a recipe setup procedure using zonal analysis with respect to at least one setup parameter, wherein the zonal analysis comprises spatially variable values of the at least one setup parameter across at least one wafer, wherein the zonal analysis is applied during a ranking phase of the recipe setup procedure, and wherein the zonal analysis is carried out with respect to concentric zones configured to distinguish at least a wafer center from wafer edges; and
    carrying out metrology measurements on the wafer with a metrology tool using the zonal analysis with respect to at least one metrology metric.

2. The method of claim 1, wherein the zonal analysis is used during a data collection phase and/or during a detailed sampling phase of the recipe setup procedure.

3. The method of claim 1, wherein the at least one setup parameter comprises a plurality of setup parameters and wherein the zonal analysis comprises different wafer zones with respect to different parameters.

4. The method of claim 1, wherein the at least one setup parameter comprises any of: sensitivity, at least one accuracy indicator, at least one target quality indicator, at least one performance indicator and at least one process indicator.

5. The method of claim 1, wherein the at least one metrology metric comprises a plurality of metrology metrics and wherein the zonal analysis comprises different wafer zones with respect to different metrics.

6. The method of claim 5, wherein the at least one metrology metric comprises any of: overlay, residuals, tool performance parameters, and quality matrices.

7. The method of claim 1, wherein the at least one metrology metric comprises any of: overlay, residuals, tool performance parameters, and quality matrices.

8. The method of claim 1, wherein the zonal analysis is carried out in a spatially continuous manner.

9. The method of claim 8, wherein the zonal analysis is carried out with respect to tunable spectrum illumination and the at least one setup parameter comprise an illumination wavelength.

10. The method of claim 1, wherein the zonal analysis is carried out with respect to a plurality of wafers.

11. The method of claim 1, at least partly carried out by at least one computer processor.

12. A computer program product comprising a non-transitory computer readable storage medium having computer readable program embodied therewith, the computer readable program configured to carry out the method of claim 1.

13. A metrology module comprising the computer program product of claim 12.

* * * * *